United States Patent
Wu

(10) Patent No.: US 12,426,233 B2
(45) Date of Patent: Sep. 23, 2025

(54) SEMICONDUCTOR DEVICE AND MANUFACTURING METHOD THEREOF

(71) Applicant: CHANGXIN MEMORY TECHNOLOGIES, INC., Hefei (CN)

(72) Inventor: Ping-Heng Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 226 days.

(21) Appl. No.: 17/615,059

(22) PCT Filed: May 24, 2021

(86) PCT No.: PCT/CN2021/095566
§ 371 (c)(1),
(2) Date: Nov. 29, 2021

(87) PCT Pub. No.: WO2022/012167
PCT Pub. Date: Jan. 20, 2022

(65) Prior Publication Data
US 2023/0126464 A1  Apr. 27, 2023

(30) Foreign Application Priority Data
Jul. 17, 2020 (CN) .......................... 202010692526.6

(51) Int. Cl.
*H10B 12/00* (2023.01)
*H01L 21/311* (2006.01)
(Continued)

(52) U.S. Cl.
CPC ........ *H10B 12/03* (2023.02); *H01L 21/31111* (2013.01); *H01L 21/4825* (2013.01);
(Continued)

(58) Field of Classification Search
CPC ...... H10B 12/03; H10B 12/09; H10B 12/033; H10B 12/318; H10B 63/00; H10D 1/692
See application file for complete search history.

(56) References Cited

U.S. PATENT DOCUMENTS 5,843,822 A  12/1998  Hsia et al.
6,387,773 B1  5/2002  Engelhardt
(Continued)

FOREIGN PATENT DOCUMENTS

CN  110504283 A  11/2019
CN  111403601 A  7/2020

OTHER PUBLICATIONS

International Search Report in Application No. PCT/CN2021/095566, mailed on Aug. 19, 2021.

*Primary Examiner* — Zandra V Smith
*Assistant Examiner* — John M Parker
(74) *Attorney, Agent, or Firm* — SYNCODA LLC; Feng Ma

(57) ABSTRACT

A semiconductor device includes: a substrate, and a plurality of conductors. A plurality of conductors are configured to form first electrodes of capacitor structures, and are distributed on one side of the substrate in rows and columns. Each of the conductors comprises a columnar body and a plurality of annular bumps. A part of an axial direction of the columnar body is intersected with the substrate. The annular bumps are arranged around the circumference of the columnar body, and a protruding direction of the annular bumps is parallel to the substrate. The plurality of annular bumps are distributed at intervals in the axial direction of the columnar body. Annular bumps of the conductors adjacent in row and column directions are staggered in a direction perpendicular to the substrate.

6 Claims, 17 Drawing Sheets

(51) Int. Cl.
  *H01L 21/48* (2006.01)
  *H01L 21/768* (2006.01)
  *H10B 63/00* (2023.01)
  *H10D 1/68* (2025.01)

(52) U.S. Cl.
  CPC ....... *H01L 21/76877* (2013.01); *H10B 12/09* (2023.02); *H10B 63/00* (2023.02); *H10D 1/692* (2025.01)

(56) References Cited

U.S. PATENT DOCUMENTS

| | | | |
|---|---|---|---|
| 6,624,018 B1 * | 9/2003 | Yu | H10D 1/714 |
| | | | 438/243 |
| 7,126,180 B2 | 10/2006 | Park | |
| 7,205,241 B2 | 4/2007 | Park et al. | |
| 7,999,350 B2 | 8/2011 | Lu et al. | |
| 10,197,876 B2 | 2/2019 | Wang et al. | |
| 10,622,363 B2 | 4/2020 | Sills | |
| 10,825,815 B2 * | 11/2020 | Tang | H10B 12/033 |
| 10,886,195 B2 * | 1/2021 | Ingerly | H01L 23/562 |
| 2021/0288047 A1 * | 9/2021 | Lee | H10D 1/68 |
| 2022/0020711 A1 * | 1/2022 | Chu | H01L 24/05 |

* cited by examiner

SEMICONDUCTOR DEVICE AND MANUFACTURING METHOD THEREOF

CROSS-REFERENCE TO RELATED APPLICATIONS

This application is a national stage of International Application No. PCT/CN2021/095566 filed on May 24, 2021 which claims priority to Chinese Patent Application No. 202010692526.6 filed on Jul. 17, 2020, which is. The disclosures of the above-referenced applications are hereby incorporated by reference in their entirety.

TECHNICAL FIELD

The present disclosure relates to the technical field of storage, and in particular to a semiconductor device and a manufacturing method thereof.

BACKGROUND

The memory is usually composed of a plurality of memory units, each of which comprises capacitor structures each capable of storing a logic "1" or "0". In the related art, due to the limitation of lithography and other factors, only a few capacitor structures or only capacitor structures with lower capacitance can be formed in a limited size of the memory.

It should be noted that the information disclosed in the background section is only provided to enhance the understanding of the background of the present disclosure, and therefore may include information that does not constitute the existing technologies known to a person of ordinary skill in the art.

SUMMARY

According to one aspect of the present disclosure, a semiconductor device is provided, comprising a plurality of capacitor structures, the semiconductor device further comprising: a substrate and a plurality of conductors. The plurality of conductors are configured to form first electrodes of capacitor structures, and are distributed on one side of the substrate in rows and columns. Each of the conductors comprises a columnar body and a plurality of annular bumps. A part of an axial direction of the columnar body is intersected with the substrate. The annular bumps are arranged around the circumference of the columnar body. The plurality of annular bumps are distributed at intervals in the axial direction of the columnar body. Annular bumps of the conductors adjacent in row and column directions are staggered in a direction perpendicular to the substrate.

In an exemplary embodiment of the present disclosure, orthographic projections of annular bumps of the conductors adjacent in row and column directions on the substrate are at least partially overlapped.

In an exemplary embodiment of the present disclosure, each of the conductors is configured to form a first electrode of one of the capacitor structures.

In an exemplary embodiment of the present disclosure, the plurality of conductors are configured to form a first electrode of one of the capacitor structures.

In an exemplary embodiment of the present disclosure, the semiconductor device further comprises electrical connection layers which are located between the substrate and the conductors and configured to electrically connect the plurality of conductors in one or more capacitor structures.

In an exemplary embodiment of the present disclosure, the semiconductor device further comprises a first dielectric layer and a first conductive layer. The first dielectric layer covers the conductors. The first conductive layer is located on a side of the first dielectric layer away from the substrate, covers the first dielectric layer, and is configured to form second electrodes of the capacitor structures.

In an exemplary embodiment of the present disclosure, the semiconductor device further comprises an electrode connection layer which is arranged on a side of the first conductive layer away from the substrate and covers the first conductive layer.

In an exemplary embodiment of the present disclosure, in the conductors, the annular bumps have protrusions in the same size or different sizes in a direction perpendicular to the side face of the columnar body.

In an exemplary embodiment of the present disclosure, the material of the conductors comprises one or more of tungsten, titanium, nickel, aluminum, platinum, titanium nitride, N-type polycrystalline silicon and P-type polycrystalline silicon.

According to one aspect of the present disclosure, a method for manufacturing a semiconductor device is provided, the semiconductor device comprising a plurality of capacitor structures, the method comprising following steps:

providing a substrate;

forming a composite layer on the substrate, the composite layer comprising first material layers and second material layers which are alternately stacked in sequence;

forming, on the composite layer, a plurality of through vias distributed in rows and columns and running through the composite layer, the plurality of through vias comprising a plurality of first through vias and a plurality of second through vias, each of the first through vias being only adjacent to the second through vias in row and column directions, each of the second through vias being only adjacent to the first through vias in row and column directions;

injecting a first etching solution into the first through vias, an etching speed of the first etching solution for the first material layers being greater than that of the first etching solution for the second material layers so that annular recesses are formed on sidewalls of the first through vias in the first material layers;

injecting a second etching solution into the second through vias, an etching speed of the second etching solution for the second material layers being greater than that of the second etching solution for the first material layers so that annular recesses are formed on sidewalls of the second through vias in the second material layers; and filling a conductive material in the through vias to form conductors in the through vias, the conductors being configured to form first electrodes of the capacitor structures.

In an exemplary embodiment of the present disclosure, orthographic projections of annular bumps of the conductors adjacent in row and column directions on the substrate are at least partially overlapped.

In an exemplary embodiment of the present disclosure, the material for the first material layers is silicon oxide, and the material for the second material layers is a silicon nitride; and, the first etching solution is hydrofluoric acid, and the second etching solution is phosphoric acid.

In an exemplary embodiment of the present disclosure, after filling the conductive material in the through vias, the method further comprises:

removing the first material layers and the second material layers;

forming a first dielectric layer on the surfaces of the conductors; and forming a first conductive layer on a side of the first dielectric layer away from the substrate, the first conductive layer covering the first dielectric layer, the first conductive layer being configured to form second electrodes of the capacitor structures.

In an exemplary embodiment of the present disclosure, the method for manufacturing a semiconductor device further comprises:

forming a third conductive layer between the substrate and the composite layer; and patterning the third conductive layer so that the third conductive layer forms a plurality of separate connection structures, each of the connection structures being configured to electrically connect one or more conductors in the capacitor structures.

In an exemplary embodiment of the present disclosure, before forming, on the composite layer, a plurality of through vias distributed in rows and columns and running through the composite layer, the method further comprises:

doping a preset concentration of ions into the first material layers and the second material layers to adjust an etching speed for the first material layers or the second material layers.

In an exemplary embodiment of the present disclosure, the first through vias are firstly formed on the composite layer, and annular recesses are formed on sidewalls of the first through vias in the first material layers; and then, the second through vias running through the composite layer are formed on the composite layer; and after forming annular recess on sidewalls of the first through vias in the first material layers and before forming, on the composite layer, the second through vias running through the composite layer, the method further comprises:

injecting a sacrificial material into the first through vias.

In an exemplary embodiment of the present disclosure, the conductive material is firstly filled in the second through vias and then filled in the first through vias; and after filling the conductive material in the second through vias, the method further comprises:

removing the sacrificial material.

It should be understood that the aforementioned general description and following detailed description are merely exemplary and explanatory, and the present disclosure is not limited thereto.

BRIEF DESCRIPTION OF THE DRAWINGS

The drawings herein are incorporated into the specification and constitute a part of the specification. The drawings show embodiments of the present disclosure, and explain, together with the specification, the principle of the present disclosure. Apparently, the drawings to be used in the following description show only some embodiments of the present disclosure. For a person of ordinary skill in the art, other drawings may be obtained according to these drawings, without paying any creative effort.

DETAILED DESCRIPTION

Figure 1:
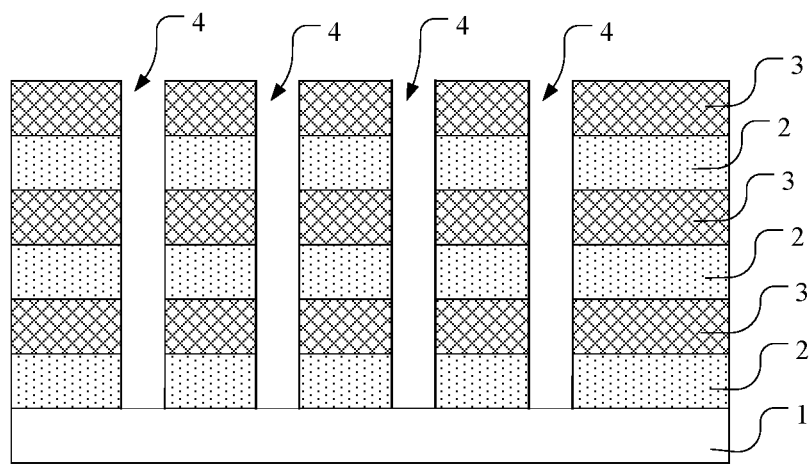
FIGS. 1-5 are schematic structure diagrams of various stages in a process of manufacturing a semiconductor device in the related art.

Exemplary embodiments will now be described more fully with reference to the accompanying drawings. However, the exemplary embodiments may be implemented in various forms, and should not be construed as being limited to the examples set forth herein; instead, these embodiments are provided to make the present disclosure more comprehensive and complete, and to fully convey the concepts of the exemplary embodiments to those skilled in the art. The same reference numerals in the drawings denote the same or similar structures, and thus the repeated description thereof will be omitted.

The words "a", "an" and "the" are used to indicate the presence of one or more elements/components/etc. The words "comprise" and "have" are used to indicate an open inclusion, and mean that there may be other elements/components/etc. in addition to the listed elements/components/etc.

Figure 2:
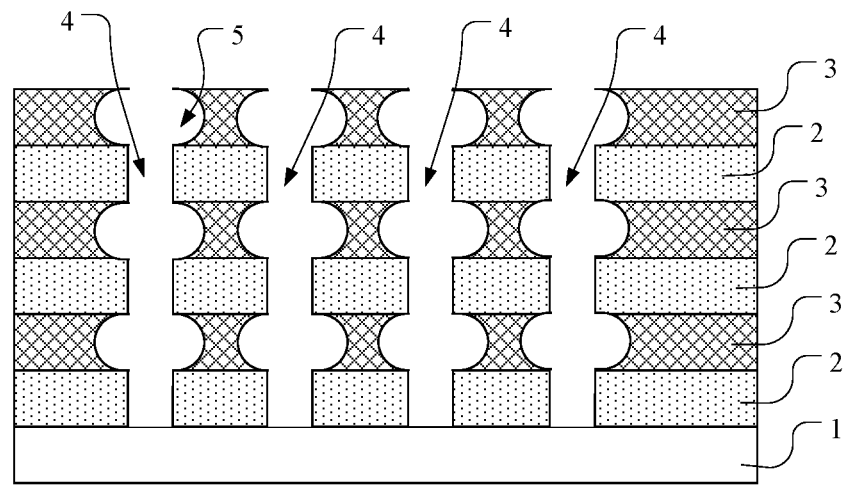
Figure 3:
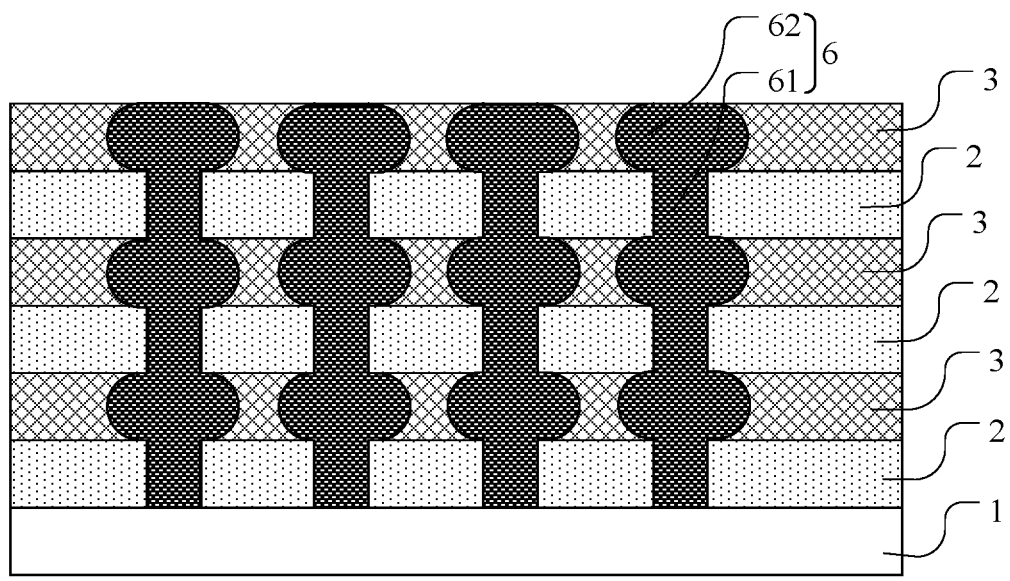
Figure 4:
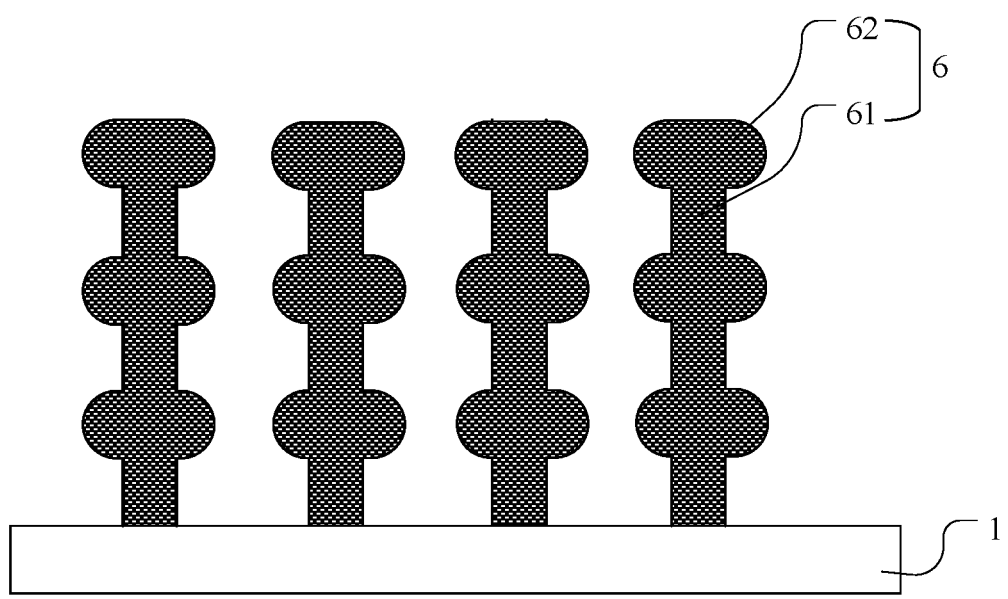
Figure 5:
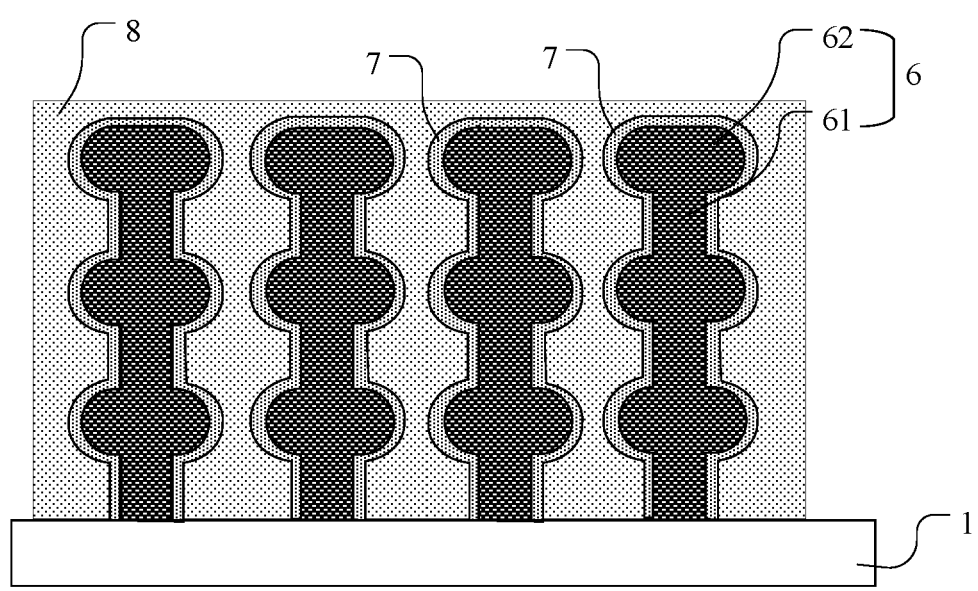
Figure 6:
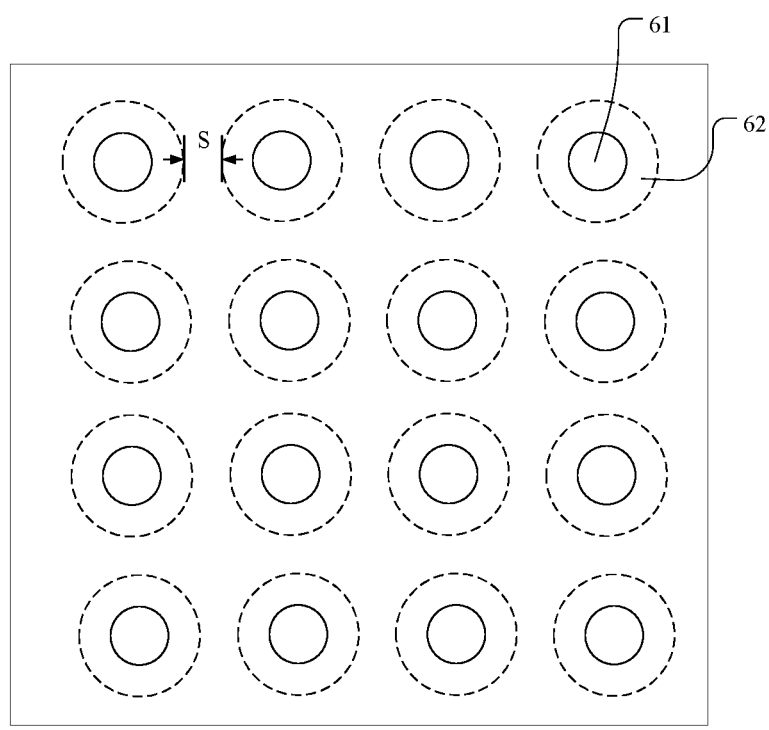
FIG. 6 is a top view of the semiconductor device in the related art.

In the related art, the memory is usually composed of a plurality of memory units, each of which comprises capacitor structures each capable of storing a logic "1" or "0". In the related art, a method for manufacturing a semiconductor method is proposed. FIGS. 1-5 show schematic structure diagrams of various stages in a process of manufacturing a semiconductor device in the related art. As shown in FIG. 1, the method for manufacturing a semiconductor device proposed in the related art comprises following steps: forming, on a substrate 1, a plurality of first material layers 2 and second material layers 3 which are stacked alternately, and forming a plurality of through vias 4 distributed in an array on the first material layers 2 and the second material layers 3 by an etching process. As shown in FIG. 2, an etching solution is poured into the through vias 4. The etching speed of the etching solution for the second materials 3 is greater than that for the first material layers 2, so that annular recesses 50 can be formed on inner walls of the through vias 4 in the second material layers. As shown in FIG. 3, a conductive material is filled in the through vias 4 and the recesses 50 to form conductors 6. The conductors 6 comprise cylindrical bodies 611 filled in the through vias 4 and annular bumps 612 filled in the recesses 50. As shown in FIG. 4, the plurality of first material layers 2 and second material layers 3 are removed. The conductors 6 can be used as first electrodes of the capacitor structures. In addition, as shown in FIG. 5, the manufacturing method may further comprise: forming a dielectric layer 7 on the surfaces of the conductors 6, and forming a conductive layer 8 on a side of the dielectric layer 7 away from the substrate 1. The conductive layer 8 can form second electrodes of the capacitor structures. Each of the conductors 6 can form a capacitor structure together with the conductive layer 8. It should be understood that the plurality of conductors 6 may be electrically connected to each other, so as to form a capacitor structure together with the conductive layer 8. As shown in FIG. 6 which is a top view of the semiconductor device in the related art, during etching the annular recesses 50, in order to avoid communication between annular recesses 50 adjacent in row and column directions, it is necessary to reserve a large distance between through vias 4 adjacent in row and column directions, so that there is a certain distance S between recesses 5-50 adjacent in row and column directions. In the related art, since there is a certain distance S between adjacent recesses 50, the integration of capacitor structures in the semiconductor device is low, that is, only a few capacitor structures can be formed in a limited size of the semiconductor device.

On this basis, this exemplary embodiment provides a method for manufacturing a semiconductor device, the semiconductor device comprising a plurality of capacitor structures, the method comprising following steps:

S1: providing a substrate;

S2: forming a composite layer on the substrate, the composite layer comprising first material layers and second material layers which are alternately stacked in sequence;

S3: forming, on the composite layer, the plurality of through vias distributed in rows and columns and running through the composite layer, the plurality of through vias comprising a plurality of first through vias and a plurality of second through vias, each of the first through vias being adjacent to the second through vias in row and column directions, each of the second through vias being adjacent to the first through vias in row and column directions;

S4: injecting a first etching solution into the first through vias, the etching speed of the first etching solution for the first material layers being greater than that of the first etching solution for the second material layers so that annular recesses are formed on sidewalls of the first through vias in the first material layers;

S5: injecting a second etching solution into the second through vias, the etching speed of the second etching solution for the second material layers being greater than that of the second etching solution for the first material layers so that annular recesses are formed on sidewalls of the second through vias in the second material layers; and S6: filling a conductive material in the through vias to form conductors in the through vias, the conductors being configured to form first electrodes of the capacitor structures.

The above steps will be detailed below.

Figure 7:
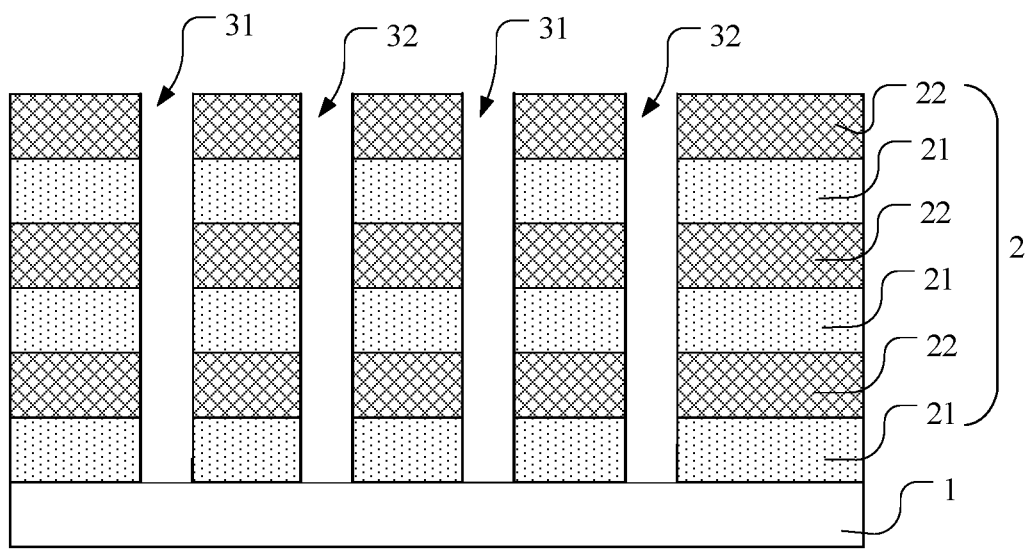
FIG. 7 is a sectional view of a semiconductor device semi-finished product in a row/column direction according to an exemplary embodiment of the present disclosure.
Figure 8:
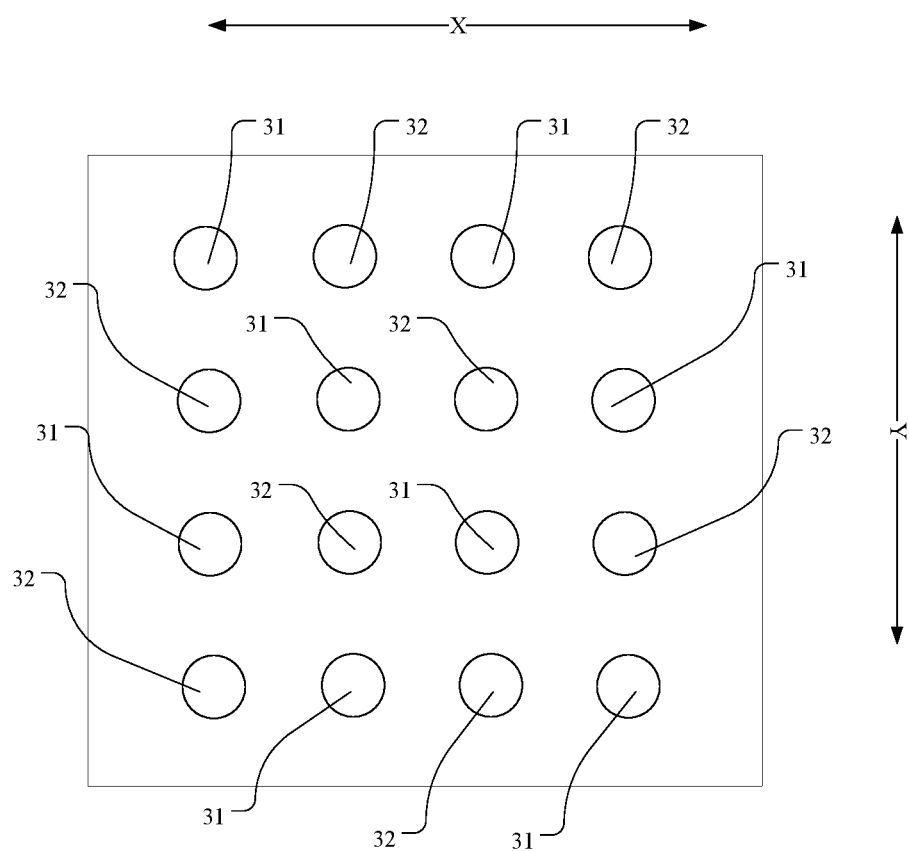
FIG. 8 is a top view of a semiconductor device semi-finished product according to an exemplary embodiment of the present disclosure.

As shown in FIG. 7, a sectional view of a semiconductor device semi-finished product in a row/column direction according to an exemplary embodiment of the present disclosure is shown. S1 comprises: providing a substrate 1. S2 comprises: forming a composite layer 2 on the substrate 1, wherein the composite layer 2 may comprise first material layers 21 and second material layers 22 which are alternately stacked in sequence. There may be a plurality of first material layers 21 and a plurality of second material layers 22, and the number of the first material layers 21 and the number of the second material layers 22 may be the same or different. The bottommost layer in the composite layer 2 facing the substrate may be a first material layer 21 or a second material layer 22. As shown in FIGS. 7 and 8, FIG. 8 is a top view of a semiconductor device semi-finished product according to an exemplary embodiment of the present disclosure. S3 comprises: forming, on the composite layer 2, the plurality of through vias distributed in rows and columns and running through the composite layer, wherein the plurality of through vias comprise the plurality of first through vias 31 and the plurality of second through vias 32, each of the first through vias 31 is adjacent to the second through vias 32 in row and column directions, and each of the second through vias 32 is adjacent to the first through vias 31 in row and column directions. The row direction may be X, and the column direction may be Y. The first through vias 31 and the second through vias 32 may be cylindrical through vias, which may be the same in opening size. The through vias may be formed by dry etching, plasma etching or wet etching. In order to make the through vias have a similar opening size in a stacking direction of the composite layer 2, the etching process for the through vias may be preferably dry etching or plasma etching.

Figure 9:
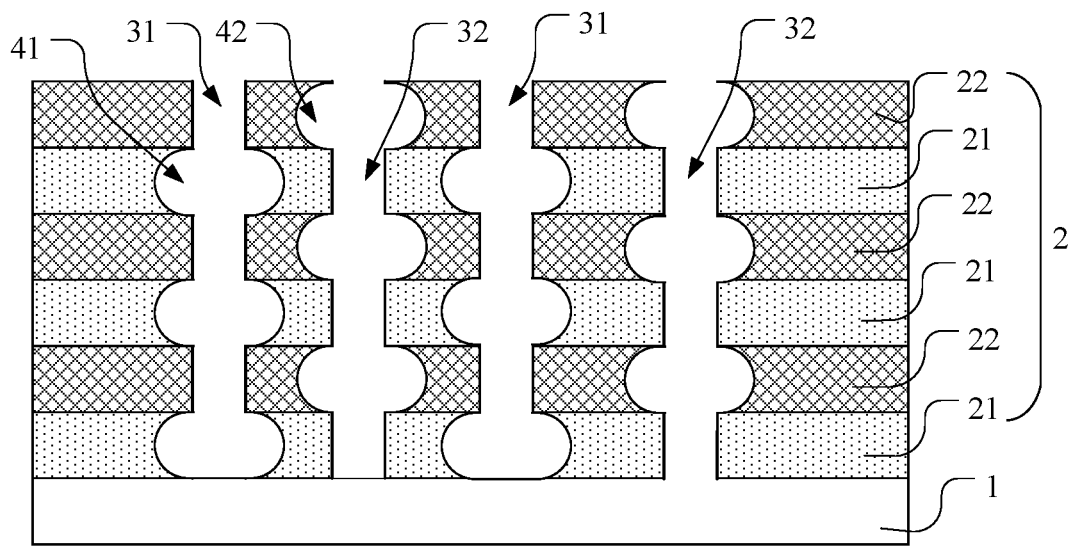
FIG. 9 is a sectional view of a semiconductor device semi-finished product in a row/column direction according to an exemplary embodiment of the present disclosure.

As shown in FIG. 9, a sectional view of a semiconductor device semi-finished product in a row/column direction according to an exemplary embodiment of the present disclosure is shown. S4 comprises: injecting a first etching solution into the first through vias 31, the etching speed of the first etching solution for the first material layers being greater than that of the first etching solution for the second material layers so that annular recesses 41 are formed on sidewalls of the first through vias in the first material layers. S5 comprises: injecting a second etching solution into the second through vias 32, the etching speed of the second etching solution for the second material layers being greater than that of the second etching solution for the first material layers so that annular recesses 42 are formed on sidewalls of the second through vias in the second material layers. In this exemplary embodiment, the material for the first material layers may be silicon oxide, and the material for the second material layers for the second material layers may be silicon nitride; and, the first etching solution may be hydrofluoric acid, and the second etching solution may be phosphoric acid. It should be understood that, in other exemplary embodiments, the first material layers and the second material layers may also be formed from other materials; and correspondingly, the first etching solution and the second etching solution may also be other etching solutions.

Figure 10:
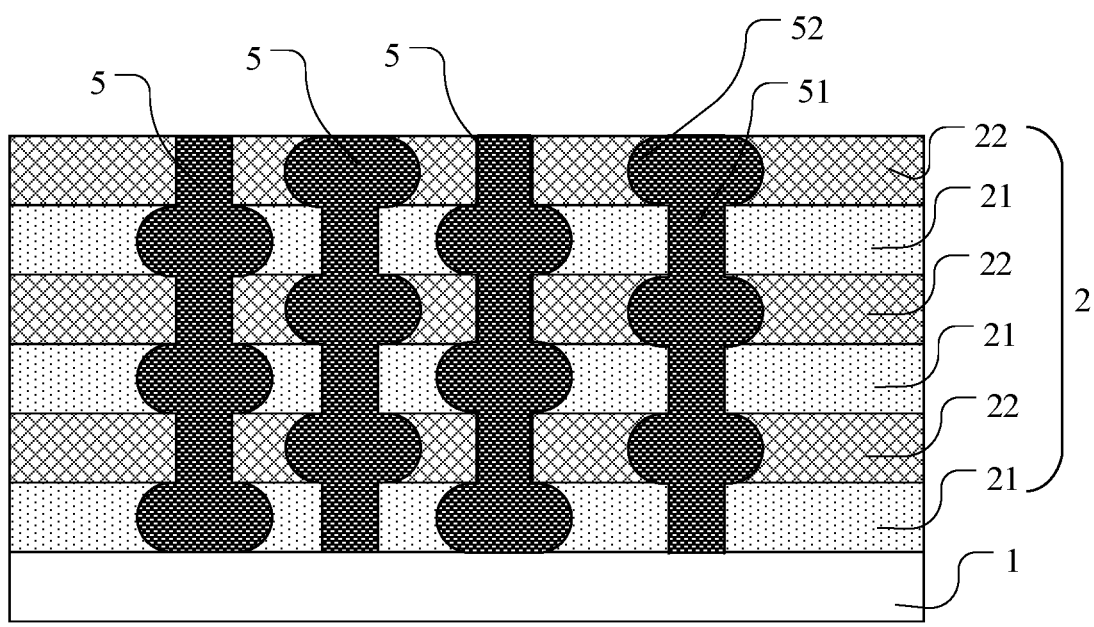
FIG. 10 is a sectional view of a semiconductor device semi-finished product in a row/column direction according to an exemplary embodiment of the present disclosure.

As shown in FIG. 10, a sectional view of a semiconductor device semi-finished product in a row/column direction according to an exemplary embodiment of the present disclosure is shown. S6 comprises: filling a conductive material in the through vias. The conductive material may be filled in the whole through vias and the recesses to form conductors 5 in the through vias. Each of the conductors 5 can be configured to form a first electrode of the capacitor structure. The conductors 5 may comprise cylindrical bodies 51 filled in the through vias and annular bumps 52 filled in the annular recesses. The material for the conductors may comprise one or more of tungsten, titanium, nickel, aluminum, platinum, titanium nitride, N-type polycrystalline silicon and P-type polycrystalline silicon.

Figure 11:
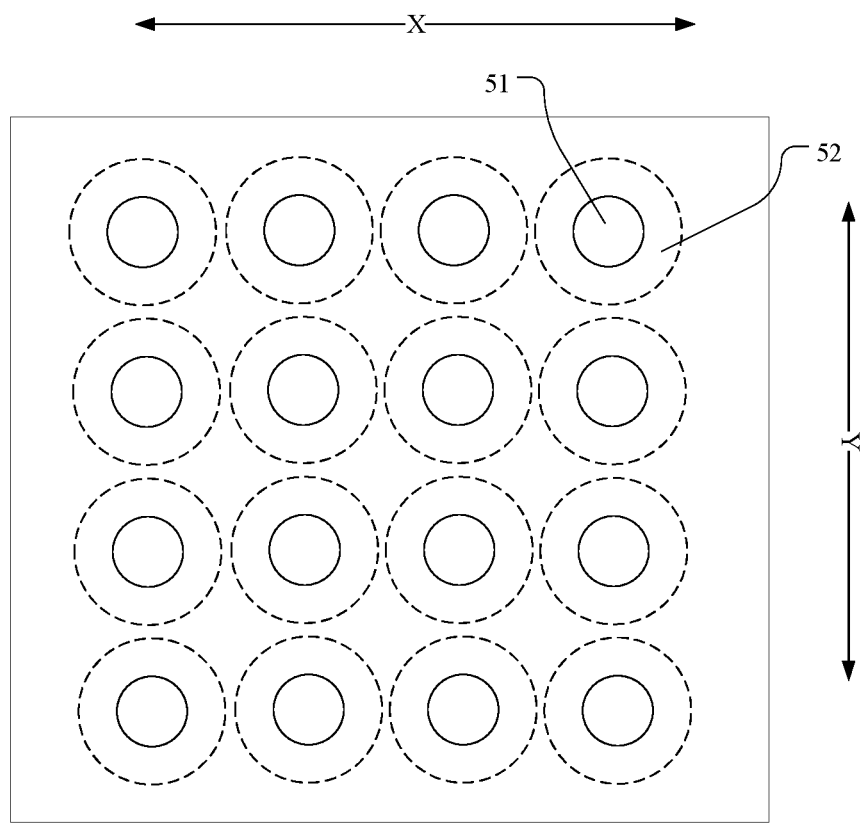
FIG. 11 is a top view of a semiconductor device semi-finished product according to an exemplary embodiment of the present disclosure.

As shown FIG. 11, a top view of a semiconductor device semi-finished product according to an exemplary embodiment of the present disclosure is shown. It can be known from comparison of FIGS. 6 and 11 that, even in FIG. 11, the distance between orthographic projections of annular bumps 52 adjacent in row and column directions (the row direction is X and the column direction is Y) on the substrate is relatively small. However, it can be known from FIG. 10 that there is a large reserved space between annular bumps 52 adjacent in row and column directions. That is, in this exemplary embodiment, in the process of etching annular recesses 41 and 42, a safe distance for avoiding excessive etching is reserved between the annular recesses 41 and 42. Apparently, it can be known from FIG. 11 that, in the semiconductor device provided in this exemplary embodiment, more capacitor structures can be integrated in a limited space of the semiconductor device by arranging annular bumps of conductors, which are adjacent in row and column directions, in a direction perpendicular to the substrate in a staggered manner. In addition, the annular bumps can increase the surface area of the first electrodes, thereby increasing the capacitance of the capacitor structures.

Figure 12A:
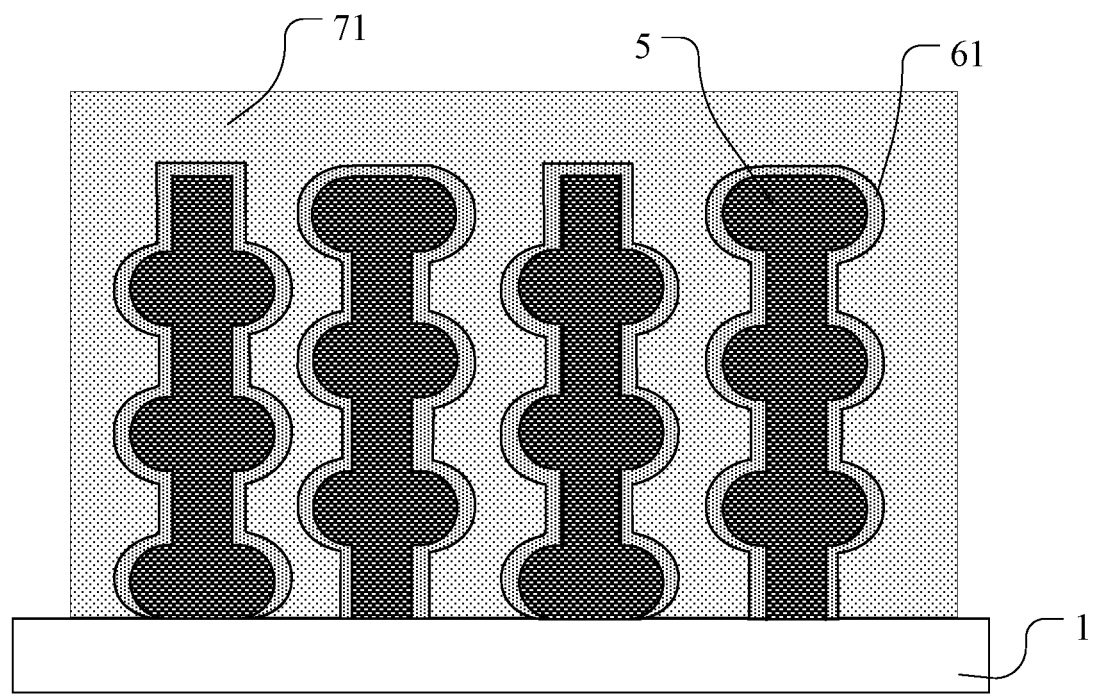
FIG. 12A is a sectional view of a semiconductor device semi-finished product in a row/column direction according to an exemplary embodiment of the present disclosure.

As FIG. 12A, a sectional view of a semiconductor device semi-finished product in a row/column direction according to an exemplary embodiment of the present disclosure is shown. The manufacturing method may further comprise: removing the first material layers 21 and the second material layers 22. The first material layers 21 and the second material layers 22 can be removed by alternating etching using the first etching solution and the second etching solution. The manufacturing method may further comprise: forming a first dielectric layer 61 on the surfaces of the conductors 5, the first dielectric layer 61 covering the conductors 5; and, forming a first conductive layer 71 on a side of the first dielectric layer 61 away from the substrate 1, the first conductive layer 71 covering the first dielectric layer 61. The first conductive layer 71 can be configured to form second electrodes of the capacitor structures. The first conductive layer 71 may be formed by a coating process, so that a film layer with an even upper surface is formed. The plurality of capacitor structures in the semiconductor device can share the first conductive layer 71 as a common electrode.

Figure 12B:
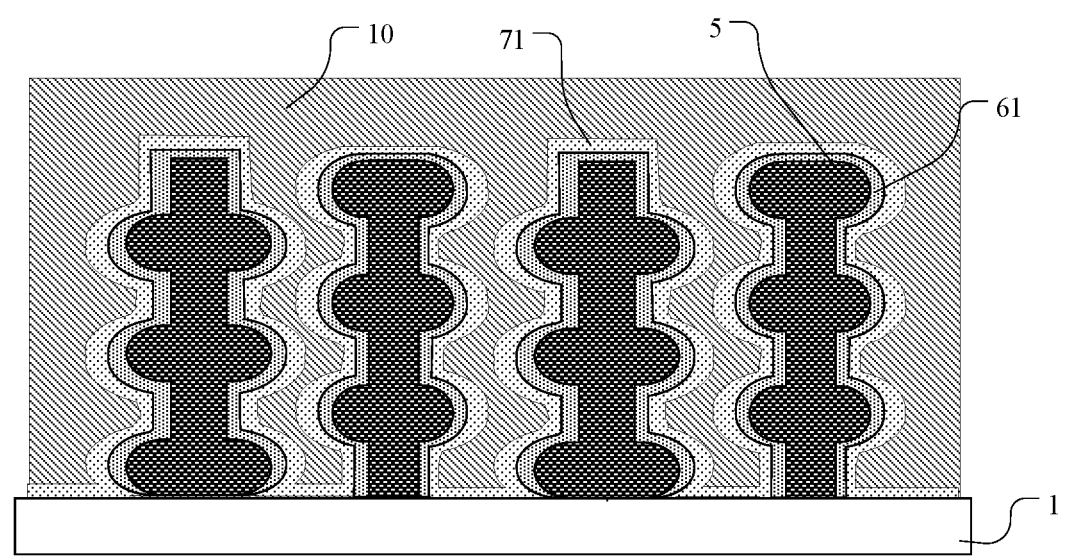
FIG. 12B is a sectional view of a semiconductor device semi-finished product in a row/column direction according to another exemplary embodiment of the present disclosure.

As shown in FIG. 12B, a sectional view of a semiconductor device semi-finished product in a row/column direction according to another exemplary embodiment of the present disclosure is shown. The manufacturing method may further comprise: forming a first dielectric layer 61 on the surfaces of the conductors 5, the first dielectric layer 61 covering the conductors 5; and, forming a first conductive layer 71 on a side of the first dielectric layer 61 away from the substrate 1, the first conductive layer 71 covering the first dielectric layer 61. The first conductive layer 71 may be formed by an evaporation process, so that a film layer in the same shape as the outer surface of the first dielectric layer 61 is formed. The semiconductor device may further comprise an electrode connection layer 10 which is arranged on a side of the first conductive layer away from the substrate and covers the first conductive layer.

Figure 13:
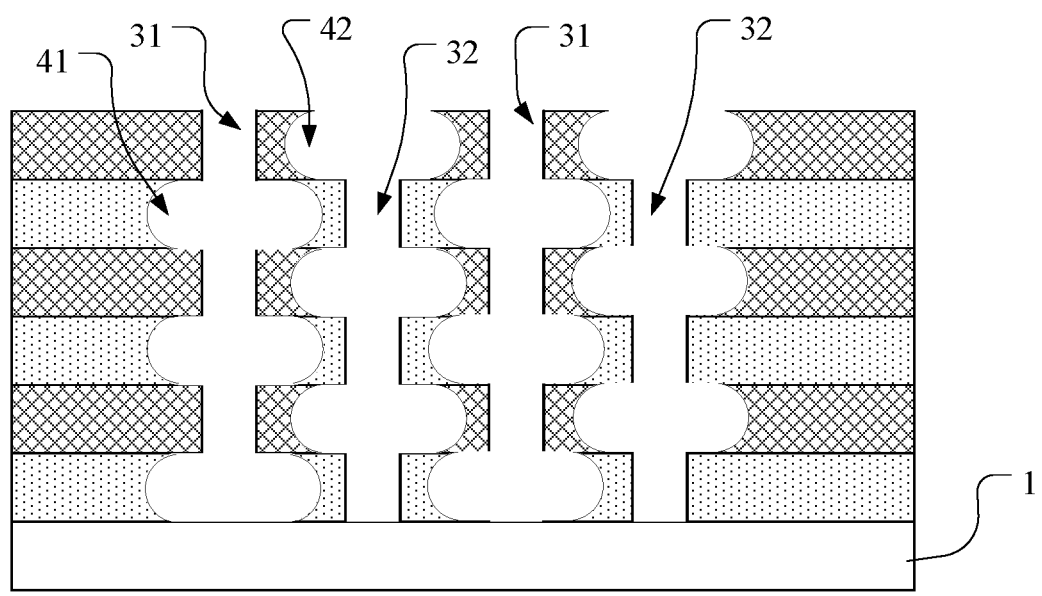
FIG. 13 is a sectional view of a semiconductor device semi-finished product in a row/column direction according to another exemplary embodiment of the present disclosure.
Figure 14:
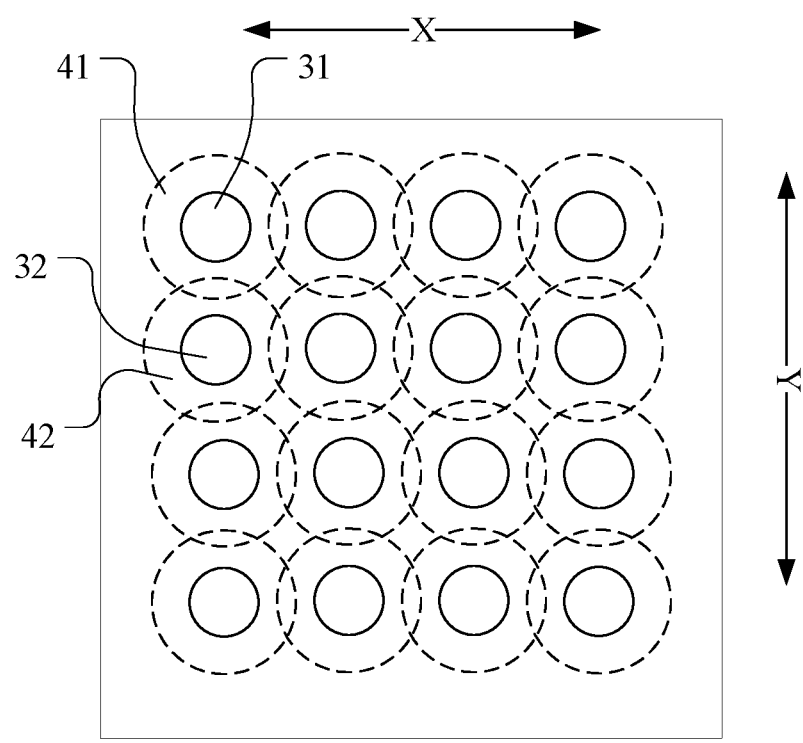
FIG. 14 is a top view of a semiconductor device semi-finished product according to another exemplary embodiment of the present disclosure.

In an exemplary embodiment of the present disclosure, as shown in FIGS. 13 and 14, FIG. 13 is a sectional view of a semiconductor device semi-finished product in a row/column direction according to another exemplary embodiment of the present disclosure, and FIG. 14 is a top view of a semiconductor device semi-finished product according to another exemplary embodiment of the present disclosure. At S4, annular recesses 41 are formed on sidewalls of the first through vias 31; and, at S5, in the process of forming annular recesses 42 on sidewalls of the second through vias 32, orthographic projections of the annular recesses 41 and 42 in the through vias 31 and 32 adjacent in row and column directions (the row direction is X and the column direction is Y) may be at least partially overlapped. With such an arrangement, the number of capacitor structures integrated in a limited space can be further increased.

Figure 15:
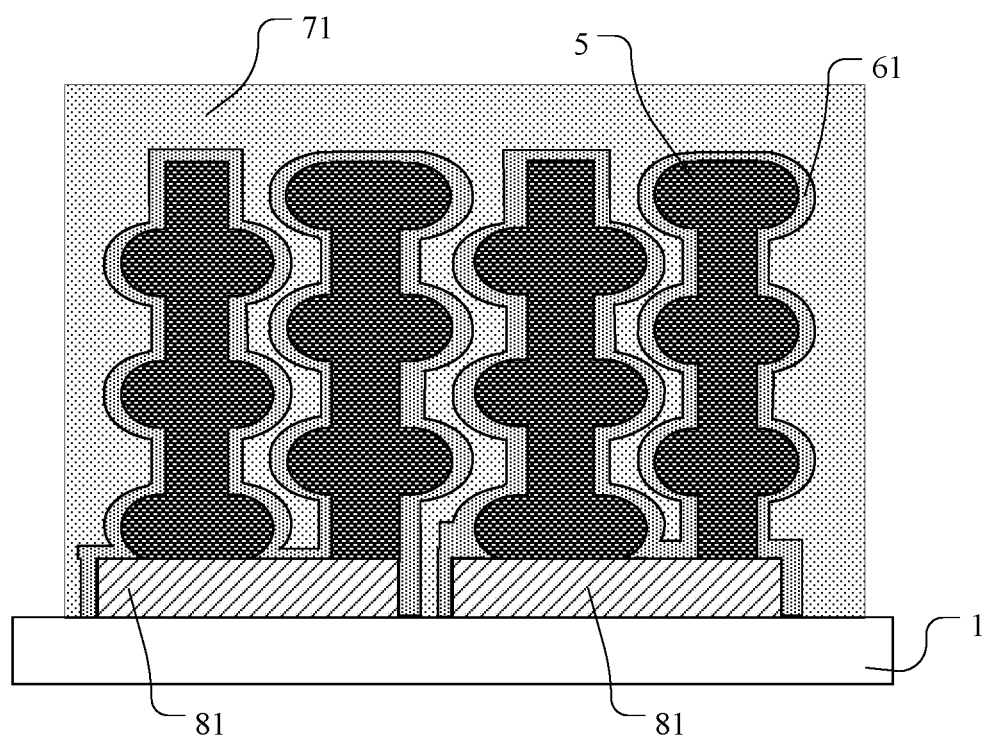
FIG. 15 is a sectional view of a semiconductor device semi-finished product in a row/column direction according to another exemplary embodiment of the present disclosure.

In an exemplary embodiment of the present disclosure, the plurality of conductors are configured to form a first electrode of one of the capacitor structures. Correspondingly, as shown in FIG. 15, a sectional view of a semiconductor device semi-finished product in a row/column direction according to another exemplary embodiment of the present disclosure is shown. The method for manufacturing a semiconductor device may further comprise: forming a third conductive layer between the substrate 1 and the composite layer 2, and patterning the third conductive layer so that the third conductive layer forms a plurality of separate connection structures 81, the connection structures 81 being configured to electrically connect the plurality of conductors 5 in one of the capacitor structures. As shown in FIG. 15, two conductors 5 are connected by one connection structure 81 to form a first electrode of a capacitor structure. It should be understood that, in other exemplary embodiments, one connection structure 81 may also be connected to another number of conductors 5, so that the plurality of conductors form a first electrode of a capacitor structure. It is to be noted that the connection structure 81 may also be connected to only on conductor 5 so as to connect the conductor 5 to other hierarchical structures (e.g., a source/drain layer of the transistor).

In this exemplary embodiment, before forming, on the composite layer, the plurality of through vias distributed in rows and columns and running through the composite layer, the method may further comprise: doping a preset concentration of ions into the first material layers and the second material layers to adjust the etching speed for the first material layers or the second material layers. The doped ions may be boron or phosphorus.

Figure 16:
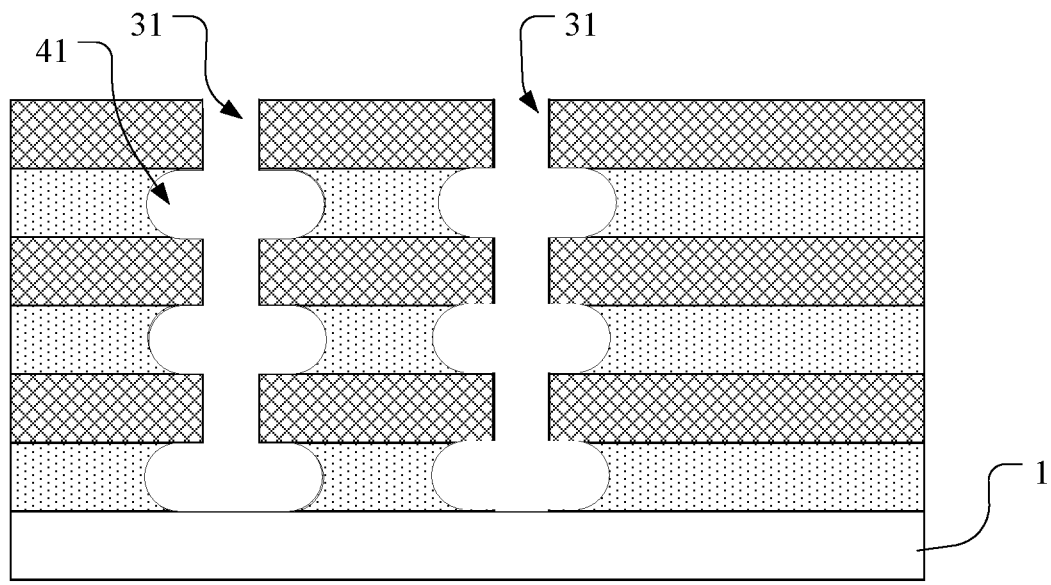
FIG. 16 is a sectional view of a semiconductor device semi-finished product in a row/column direction according to another exemplary embodiment of the present disclosure.
Figure 17:
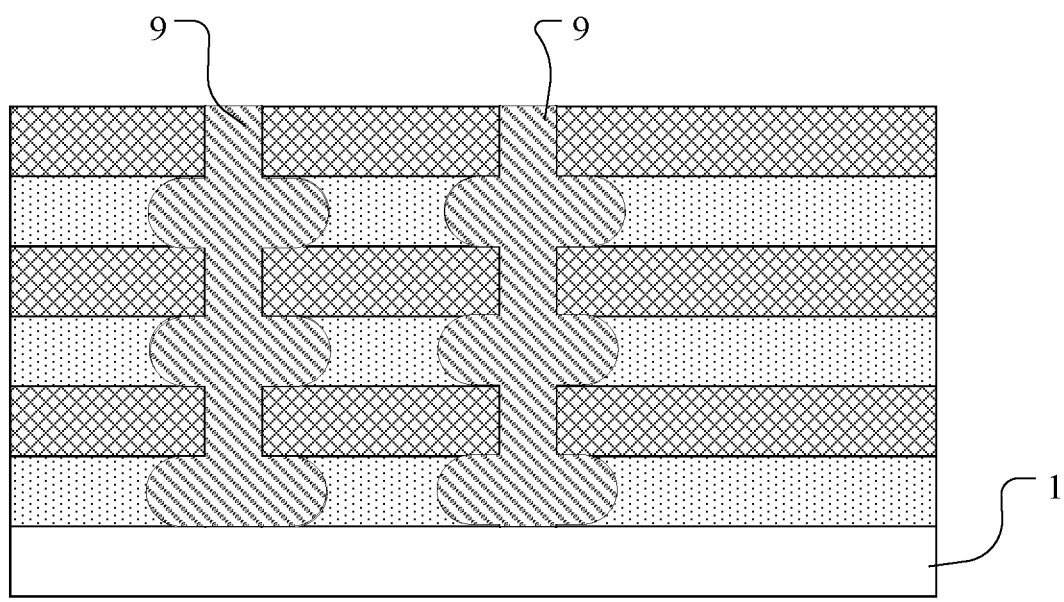
FIG. 17 is a sectional view of a semiconductor device semi-finished product in a row/column direction according to another exemplary embodiment of the present disclosure.
Figure 18:
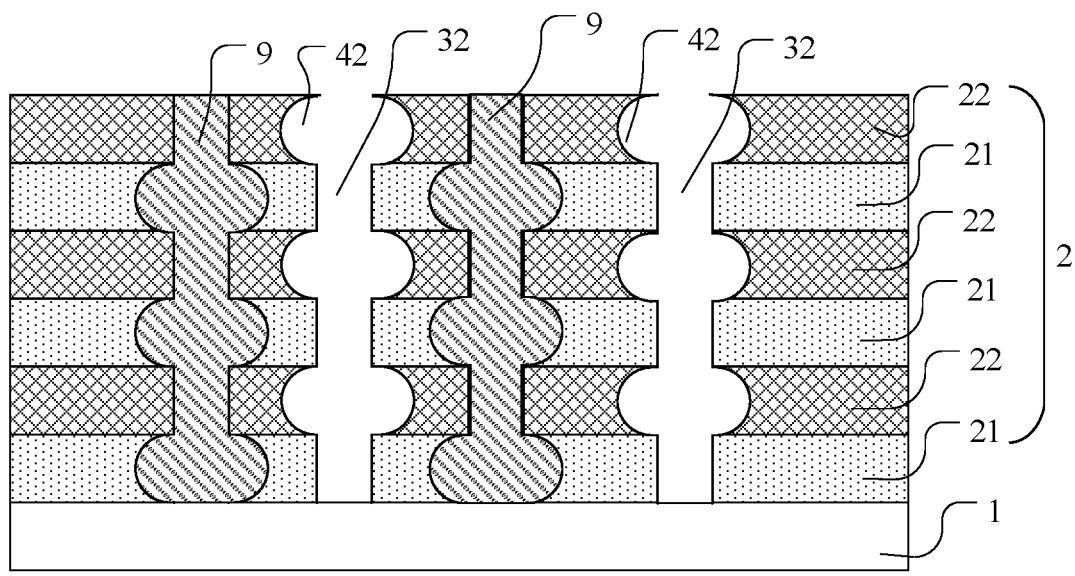
FIG. 18 is a sectional view of a semiconductor device semi-finished product in a row/column direction according to another exemplary embodiment of the present disclosure.

In this exemplary embodiment, as shown in FIG. 7, after the through vias are formed on the composite layer 2, the semiconductor device semi-finished product is reduced in rigidity and easily damaged by an external force in subsequent process flows. In an exemplary embodiment of the present disclosure, as shown in FIG. 16, a sectional view of a semiconductor device semi-finished product in a row/column direction according to another exemplary embodiment of the present disclosure is shown. The method for manufacturing a semiconductor device may comprise: forming first through vias 31 on the composite layer, and forming annular recesses 41 on sidewalls of the first through vias in the first material layers. As shown FIG. 17, a sectional view of a semiconductor device semi-finished product in a row/column direction according to another exemplary embodiment of the present disclosure is shown. Then, a sacrificial material 9 may be injected into the first through vias to fill the first through vias 31 and the annular recesses 41. The sacrificial material can increase the rigidity of the semiconductor device semi-finished product. The sacrificial material may be BPSG, silicon oxide or the like. Then, as shown in FIG. 18 which is a sectional view of a semiconductor device semi-finished product in a row/column direction according to another exemplary embodiment of the present disclosure, the second through vias 32 running through the composite layer may be formed on the composite layer, and annular recesses 42 are formed on sidewalls of the second through vias in the second material layers by an etching process. Then, a conductive material may be poured into the second through vias 32 to fill the second through vias 32 and the annular recesses 42 so as to form conductors. Then, the sacrificial material is removed, and the conductive material is poured into the first through vias 31 to fill the first through vias 31 and the annular recesses 41 so as to form conductors.

Figure 19:
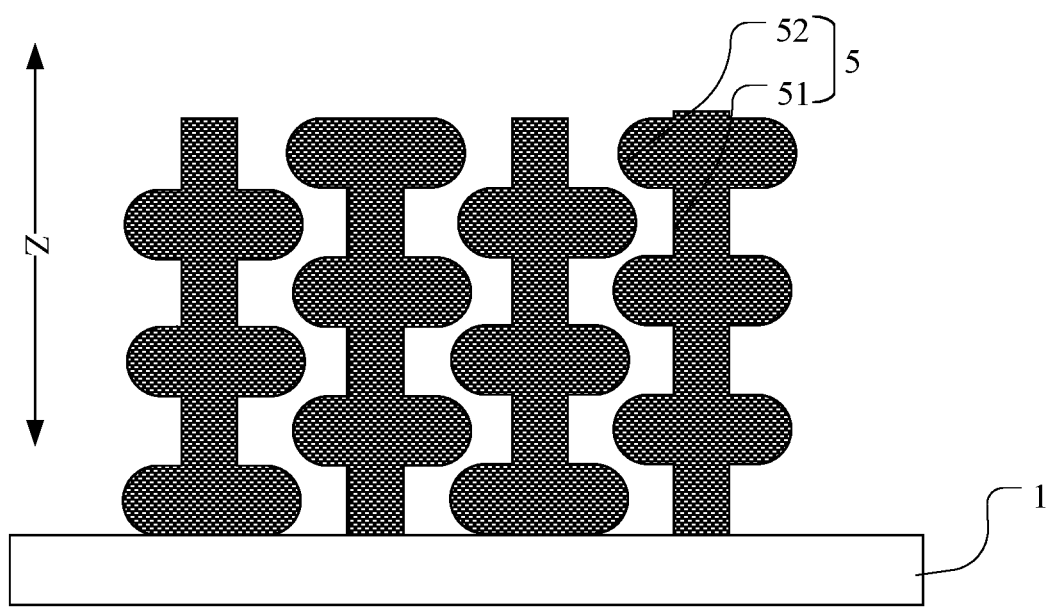
FIG. 19 is a sectional view of an exemplary embodiment of a semiconductor device in a row/column direction according to the present disclosure.
Figure 20:
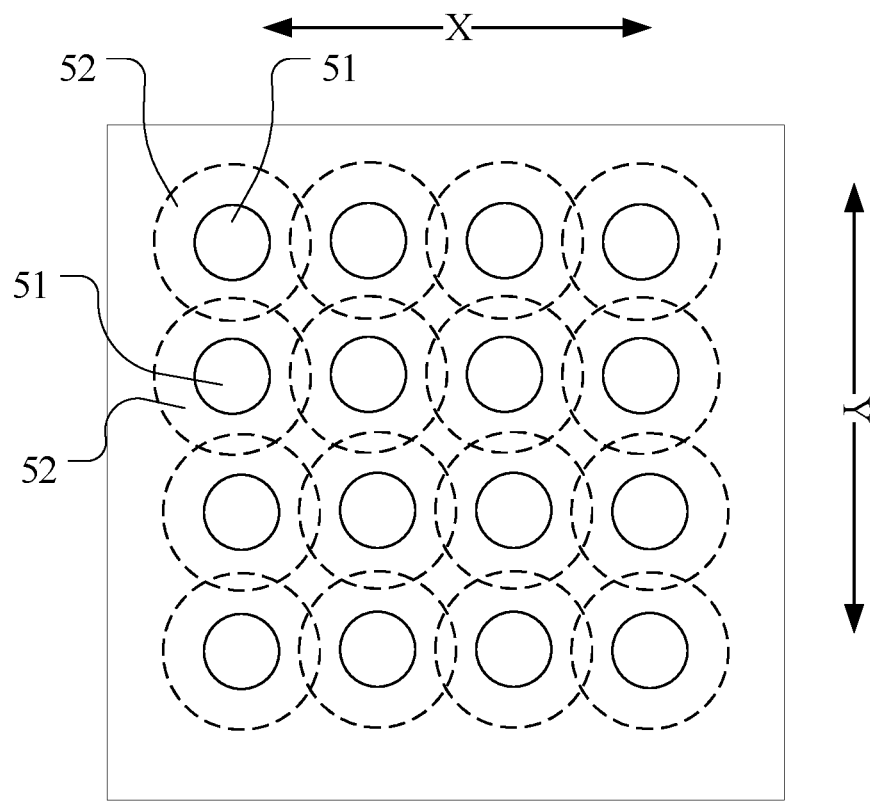
FIG. 20 is a top view of an exemplary embodiment of a semiconductor device according to the present disclosure.

The present disclosure further provides a semiconductor device. The semiconductor device may be formed by the above-described method for manufacturing a semiconductor device. As shown in FIGS. 19 and 20, FIG. 19 is a sectional view of an exemplary embodiment of the semiconductor device in a row/column direction according to the present disclosure, and FIG. 20 is a top view of an exemplary embodiment of the semiconductor device according to the present disclosure. The semiconductor device comprises the plurality of capacitor structures. The semiconductor device further comprises a substrate 1 and the plurality of conductors 5. The plurality of conductors 5 are configured to form first electrodes of capacitor structures, and are distributed on one side of the substrate 1 in rows and columns. Each of the conductors 5 comprises a columnar body 51 and the plurality of annular bumps 52. An axial direction Z of the columnar body 51 may be perpendicular to the substrate 1. The annular bumps 52 may be arranged around the circumference of the columnar body 51, and a protruding direction of the annular bumps 52 may be parallel to the substrate 1. The plurality of annular bumps 52 may be distributed at intervals in the axial direction of the columnar body 51. The annular bumps of the conductors adjacent in row and column directions (the row direction is X and the column direction is Y) may be staggered in a direction perpendicular to the substrate, that is, the annular bumps of the conductors adjacent in row and column directions will not be in a same horizontal plane that is parallel to the substrate 1. A part of an axial direction of the columnar body 51 may also be intersected with the substrate at other angles. The columnar body may be cylindrical.

In the semiconductor device provided in this exemplary embodiment, more capacitor structures can be integrated in a limited space of the semiconductor device by arranging the annular bumps of the conductors, which are adjacent in row and column directions, in a direction perpendicular to the substrate in a staggered manner. In addition, the annular bumps can increase the surface area of the first electrodes, thereby increasing the capacitance of the capacitor structures.

In this exemplary embodiment of the present disclosure, as shown in FIGS. 19 and 20, orthographic projections of annular bumps 52 of the conductors adjacent in row and column directions on the substrate may be at least partially overlapped. With such an arrangement, the number of capacitor structures integrated in a limited space can be further increased.

Figure 21:
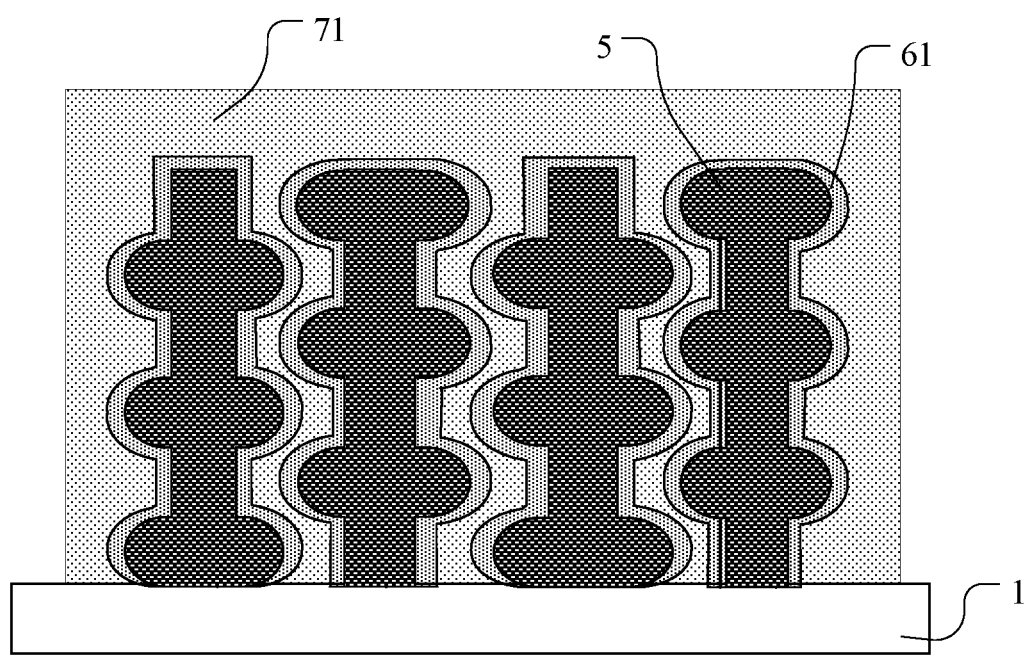
FIG. 21 is a sectional view of an exemplary embodiment of a semiconductor device in a row/column direction according to the present disclosure.

In this exemplary embodiment, as shown in FIG. 21 which is a sectional view of an exemplary embodiment of the semiconductor device in a row/column direction according to the present disclosure, each of the conductors can be configured to form a first electrode of one of the capacitor structures. The semiconductor device may further comprise a first dielectric layer 61 and a first conductive layer 71. The first dielectric layer 61 covers the conductors 5. The first conductive layer 71 is located on a side of the first dielectric layer 61 away from the substrate 1, covers the first dielectric layer 61, and is configured to form second electrodes of the capacitor structures.

Figure 22:
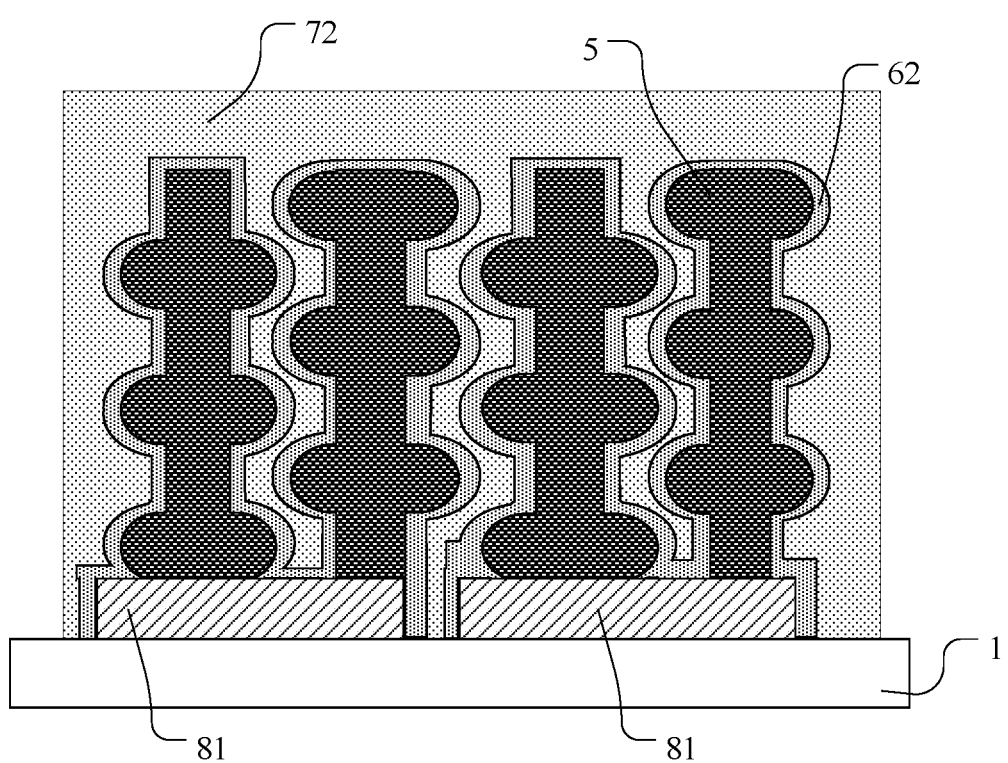
FIG. 22 is a sectional view of an exemplary embodiment of a semiconductor device in a row/column direction according to the present disclosure.

In an exemplary embodiment of the present disclosure, as shown in FIG. 22 which is a sectional view of an exemplary embodiment of the semiconductor device in a row/column direction according to the present disclosure, the plurality of conductors 5 can be configured to a first electrode of one of the capacitor structures. The semiconductor device may further comprise electrical connection layers 81 which are located between the substrate 1 and the connectors 5 and configured to electrically connect the plurality of conductors in one of the capacitor structures. Similarly, the semiconductor device may further comprise a second dielectric layer 62 and a second conductive layer 72. The second dielectric layer 62 covers the conductors 5 and the electrical connection layers 81. The second conductive layer 72 is located on a side of the dielectric layer 62 away from the substrate, covers the second dielectric layer 62 and is configured to second electrodes of the capacitor structures. It is to be noted that the electrical connection structure 81 may also be connected to only on conductor 5 so as to connect the conductor 5 to other hierarchical structures (e.g., a source/drain layer of the transistor).

In this exemplary embodiment, in the conductors, the annular bumps have protrusions in the same size or different sizes in a direction perpendicular to the side face of the columnar body.

In this exemplary embodiment, the material for the conductors may comprise one or more of tungsten, titanium, nickel, aluminum, platinum, titanium nitride, N-type polycrystalline silicon and P-type polycrystalline silicon.

It should be understood that, in other exemplary embodiments, the semiconductor device may further comprise other components, such as transistors, integrated between the substrate and the conductors 5.

Those skilled in the art will readily think of other embodiments of the present disclosure by considering the specification and practicing the content disclosed herein. The present application is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the claims.

It should be understood that the present disclosure is not limited to the precise structures that have been described above and shown in the drawings, and various modifications and changes may be made without departing from its scope. The scope of the present disclosure is defined only by the appended claims.

What is claimed is:

1. A method for manufacturing a semiconductor device, the semiconductor device comprising a plurality of capacitor structures, the method comprising:
providing a substrate;
forming a composite layer on the substrate, the composite layer comprising first material layers and second material layers which are alternately stacked in sequence;
forming, on the composite layer, a plurality of through vias distributed in rows and columns and running through the composite layer, the plurality of through vias comprising a plurality of first through vias and a plurality of second through vias, each of the first through vias being adjacent to the second through vias in row and column directions, each of the second through vias being adjacent to the first through vias in row and column directions;
injecting a first etching solution into the first through vias, an etching speed of the first etching solution for the first material layers being greater than that of the first etching solution for the second material layers so that annular recesses are formed on sidewalls of the first through vias in the first material layers;
injecting a second etching solution into the second through vias, an etching speed of the second etching solution for the second material layers being greater than that of the second etching solution for the first material layers so that annular recesses are formed on sidewalls of the second through vias in the second material layers;
filling a conductive material in the through vias to form conductors in the through vias, the conductors being configured to form first electrodes of the capacitor structures;
forming a third conductive layer between the substrate and the composite layer; and
patterning the third conductive layer so that the third conductive layer forms a plurality of separate connection structures, each of the connection structures being configured to electrically connect one or more conductors in the capacitor structures.

2. The method for manufacturing the semiconductor device according to claim 1, wherein
the material for the first material layers is silicon oxide, and the material for the second material layers is silicon nitride; and
the first etching solution is hydrofluoric acid, and the second etching solution is phosphoric acid.

3. The method for manufacturing the semiconductor device according to claim 1, after filling the conductive material in the through vias, the method further comprising:
removing the first material layers and the second material layers;
forming a first dielectric layer on the surfaces of the conductors; and
forming a first conductive layer on a side of the first dielectric layer away from the substrate, the first conductive layer covering the first dielectric layer, the first conductive layer being configured to form second electrodes of the capacitor structures.

4. The method for manufacturing the semiconductor device according to claim 1, before forming, on the composite layer, a plurality of through vias distributed in rows and columns and running through the composite layer, the method further comprising:
doping a preset concentration of ions into the first material layers and the second material layers to adjust an etching speed for the first material layers or the second material layers.

5. The method for manufacturing the semiconductor device according to claim 1 the first through vias are firstly formed on the composite layer, and annular recesses are formed on sidewalls of the first through vias in the first material layers; and then, the second through vias running through the composite layer are formed on the composite layer; and
after forming annular recess on sidewalls of the first through vias in the first material layers and before forming, on the composite layer, the second through vias running through the composite layer, the method further comprising:
injecting a sacrificial material into the first through vias.

6. The method for manufacturing the semiconductor device according to claim 5, the conductive material is firstly filled in the second through vias and then filled in the first through vias; and
after filling the conductive material in the second through vias, the method further comprising:
removing the sacrificial material.

* * * * *